Aug. 23, 1966 I. K. DORTORT 3,268,771

ELECTRICALLY INSULATED DIODE HEAT SINK

Filed Dec. 18, 1964 2 Sheets-Sheet 1

INVENTOR
ISADORE K. DORTORT

BY

OSTROLENK, FABER, GERB & SOFFEN
ATTORNEYS

Aug. 23, 1966 I. K. DORTORT 3,268,771

ELECTRICALLY INSULATED DIODE HEAT SINK

Filed Dec. 18, 1964 2 Sheets-Sheet 2

INVENTOR
ISADORE K. DORTORT

BY

OSTROLENK, FABER, GERB & SOFFEN
ATTORNEYS 3,268,771
Patented August 23, 1966

3,268,771

ELECTRICALLY INSULATED DIODE HEAT SINK

Isadore K. Dortort, Philadelphia, Pa., assignor to I-T-E Circuit Breaker Company, Philadelphia, Pa., a corporation of Pennsylvania Filed Dec. 18, 1964, Ser. No. 419,541
5 Claims. (Cl. 317—100)

This invention relates to a novel mounting structure for diodes, and more specifically relates to a novel mounting structure for a plurality of diodes wherein the diodes are electrically insulated, but substantially thermally coupled to a support structure which serves as a heat sink. It is to be noted that by diodes, I refer to that type device that induces at least one rectifying function, and that I specifically include thyristors as coming within the broad term "diode."

It is a primary object of this invention to provide a novel heat sink mounting arrangement for diodes which does not require clamping means for holding parts together.

Yet another object of this invention is to provide a novel heat sink for diodes which has heat exchange means circulating therein and receives a diode block in electrically insulated relation therewith which receives a plurality of diodes which are substantially thermally connected to the heat sink bus.

Yet another object of this invention is to provide a novel arrangement for connecting two buses together, one of which carries diodes with the two buses at a different potential with an insulation spacing means between the buses which presents a relatively low heat barrier to thermal exchange between the buses.

A further object of this invention is to provide a novel assemblage of semiconductor rectifier type devices which can directly replace an ignitron tube.

These and other objects of my invention will become apparent from the following description when taken in connnection with the drawings, in which.

Figure 1:
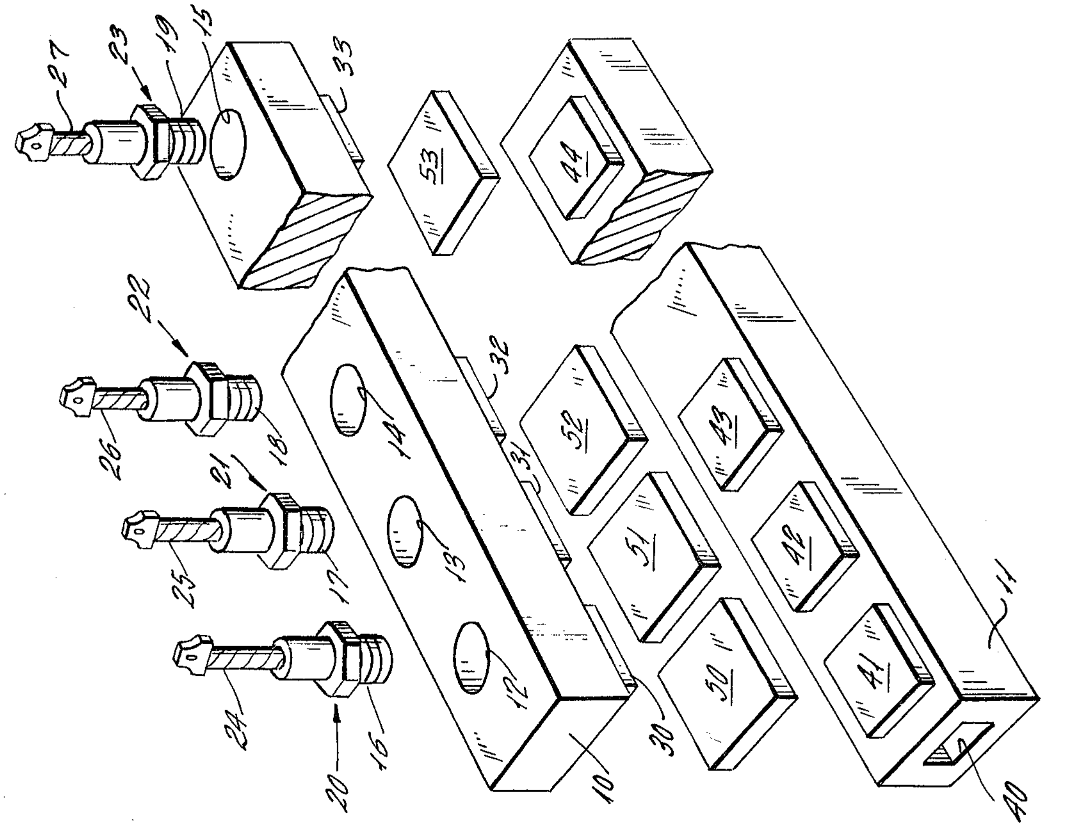
FIGURE 1 is an exploded perspective view of the novel heat sink mounting structure of the invention.
Figure 3:
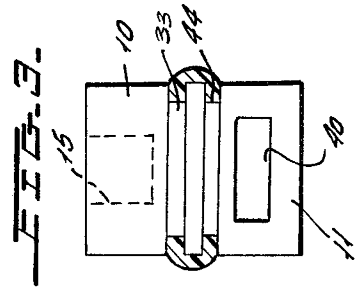
FIGURE 3 is a front plan view of the assembled structure of FIGURE 1.
Figure 2:
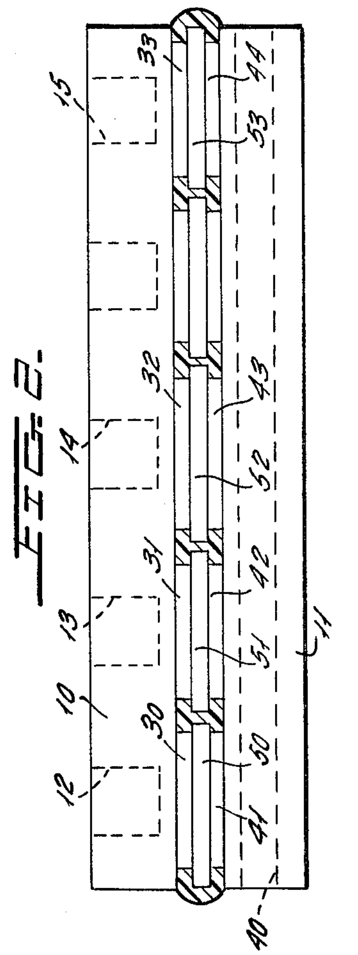
FIGURE 2 is a side plan view of the assembled structure of FIGURE 1.

Referring first to FIGURES 1, 2 and 3, I have illustrated therein a conductive bus 10 and a channeled heat sink 11 which may be as long as necessary for the reception of any desired number of diodes. The bus 10 then has a plurality of openings such as openings 12, 13, 14 and 15 tapped therein which threadably receive the threaded stud portions 16, 17, 18 and 19 of rectifiers 20, 21, 22 and 23, respectively. Note that each of the rectifiers has one terminal thereof directly connected to terminal 10, while its other terminal is defined by the upwardly extending pigtail members 24, 25, 26 and 27 in the usual manner.

The lower surface of conductor 10 is then provided with a plurality of extending bosses such as bosses 30, 31, 32 and 33 which are in alignment with the location of openings 12 through 15, respectively. Note that the bosses are spaced from one another and fall short of the side edges of bus 10, as best seen for the case of channeled heat sink 11 in FIGURE 1. Heat sink 11 of FIGURE 1 has a suitable opening 40 therein which extends along its axis and serves to conduct a heat exchange medium such as water. Clearly, any type of passage or passages could be used.

The heat sink 11 then has upwardly extending bosses 41, 42, 43 and 44 which are identical to the bosses 30 through 33, respectively, of bus 10 with the bosses of the bus and heat sink being aligned with one another.

In operation, the bus 10 and heat sink 11 are to be electrically insulated from one another. At the same time, however, it is necessary that the insulation connection between bus 10 and heat sink 11 provide only a small thermal barrier to the passage of heat from bus 10 to heat sink 11.

Figure 4:
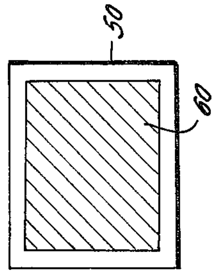
FIGURE 4 is a top plan view of one of the ceramic spacers used in FIGURE 1.
Figure 5:
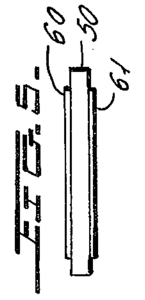
FIGURE 5 is an end view of FIGURE 4.

To this end, the aligned bosses 30 through 33 and 41 through 44, respectively, are each spaced from one another by ceramic spacers 50 through 53, respectively. The spacer 50, which is typical of all the spacers, is illustrated in FIGURES 4 and 5 as being of ceramic material of the type characterized in having a typical thermal conduction of the order of 0.05 to 0.5 Cal./° C. Satisfactory results can be obtained when using an alumina type ceramic having from 94% to 99% aluminum oxide and having a thermal conductivity of 0.075 Cal./° C. Each of the ceramic slabs 50 through 53 will have a thickness determined by the voltage between bus 10 and heat sink 11 and can typically be 0.05 inch thick. These slabs may also be of the order of 2 by 3 inches in area, with the width of bus 10 and heat sink 11 being 3 inches. They would then overlap the bosses 30 through 33 and 41 through 44 by about ¼ inch. Moreover, the bosses can be spaced from one another by about ½ inch.

In assembling the structure, a suitable cement medium is applied as a liquid between adjacent surfaces, and all excess material is then squeezed out by bringing the bodies together leaving the metal bodies and ceramic wafers separated only by a sufficient amount of the plastic material to form a bond and fill all voids.

In this manner, the high temperature drop across the plastic or epoxy cement selected for the bonding operation is held to a minimum. By way of example, most of the suitable epoxies for application to the present invention will have a thermal conduction of the order of 0.0005 Cal./° C./cm./sec. For this reason, it is critical to have the thinnest possible layer for the epoxy cement which is consistent with its ability to rigidly bond the heat sink, bus and wafer in a rigid assembly. This is compared to the 0.05 to 0.5 Cal./° C./cm./sec. existing for the ceramic slabs 50 through 53.

The entire assembly is then secured together through this cement bonding whereby it is unnecessary to provide clamping means for mechanically clamping the bus and heat sink together, thereby avoiding mechanical stresses and eliminating the insulation problems present when clamping structures are needed.

As an alternate method for assembling this structure, each of the ceramic slabs may be provided with centralized metallized surfaces shown in FIGURE 5 as metallized surfaces 60 and 61 for slab 50.

The metallized surfaces then serve to directly abut the opposing bosses of bus 10 and heat sink 11. Note that the ceramic slabs 50 through 53, as shown in FIGURE 2, are not quite large enough to abut one another when centered in position on their respective bosses.

All of the open spaces then existing between the spaced members 10 and 11 are then filled with a suitable plastic such as epoxy, as indicated by the shaded areas in FIGURES 2 and 3, which improves the electrical characteristics of the creepage surfaces.

In assembling the structure together, the metallized top and bottom surfaces of the ceramic wafer are first inspected to insure that there is a clean ceramic border to maintain creepage distance. The surfaces of the wafers can be metallized with chrome-manganese, covered with nickel and then again covered with tin. Alternatively, the wafers 50 through 53 can be directly metallized with silver which is then covered with tin. Thereafter, a light covering of some suitable soft solder is applied to the metallized surfaces, and the assembly is then held together in a suitable jig and heated in an oven to complete the asembly by fusing the tin or solder of the ceramic wafers to the respective bosses of the opposing members. This serves as the main mechanical connection between the bus 10 and heat sink 11.

The novel assembly will then serve as a unitarily constructed rectifier system having its own integral heat sink arrangement. Such devices have particular application as replacement units for ignitron tanks which may be rated as high as 670 amperes at 875 volts. For this purpose, it will be apparent that a plurality of parallel connected diodes are required, as illustrated by the plurality of diodes 20 through 23 in FIGURE 1. Moreover, these diodes even though rated at the order of 2,000 PRV in order to satisfy the 875 volts D.-C. rating may need to be connected three in series.

Note that the channel 40 in heat sink 11 may be provided with suitable connection means which is compatible with the connection means used for the cooling medium of any ignitron tube.

Figure 6:
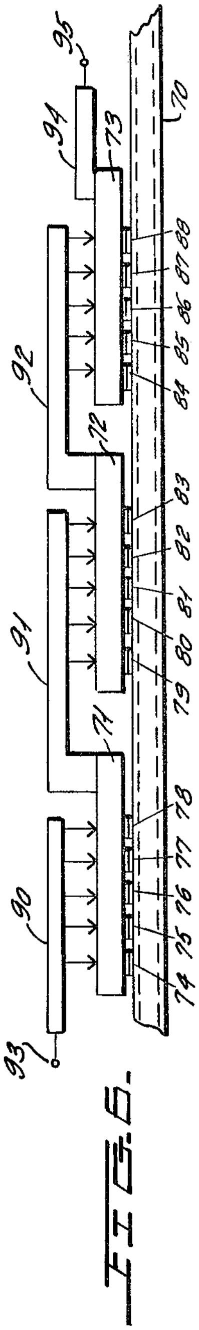
FIGURE 6 shows an embodiment of the invention for the series connection of banks of diodes.

FIGURE 6 illustrates an embodiment of the invention wherein the heat sink 11 of FIGURES 1, 2 and 3 is replaced by an extending heat sink 70 similar to heat sink 11, but extending beyond the length of a single diode block. Thereafter, a plurality of diode blocks such as the blocks 71, 72 and 73, each of which may be identical in construction to block 10 of FIGURES 1, 2 and 3, are then assembled atop of lower heat sink 70. The heat sink 70 will then have suitable extending boss sections which cooperate with similar extending boss sections from diode blocks 71 through 73 with suitable spacing ceramics inserted between opposing bosses and connected to the bosses in the manner described in FIGURES 1 through 5.

This connection between opposing bosses and ceramic slabs is schematically illustrated in FIGURE 6 at locations 74 through 88. It is to be specifically understood that each of locations 74 through 88 are arranged in a manner identical to that shown for each of the opposing bosses and interposed ceramic slabs of FIGURES 1, 2 and 3.

Thereafter, each of diode blocks 71 through 73 receives the schematically illustrated five parallel diodes in a manner identical to that shown in FIGURE 1 wherein one terminal of each of the diodes are secured to their respective blocks 71 through 73, while their other terminals are connected to bus connectors 90, 91 and 92.

The bus connector 91 is then connected to diode block 71, while bus connector 92 is connected to diode block 72. The bus connector 90 then defiines a first terminal 93 for the device while a bus 94 connected to diode block 73 defines a second terminal 95 for the device.

With the arrangement of FIGURE 6, the diode banks connected to blocks 71 through 73 are electrically connected in series with each of the banks including five parallel connected diodes. Clearly, this arrangement could be suitably modified for applying current balancing reactors to the parallel connected diodes of each of diode blocks 71 through 73.

Figure 7:
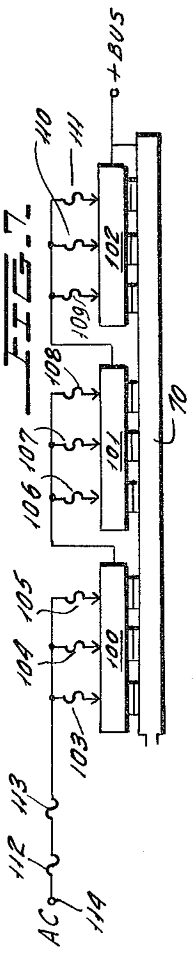
FIGURE 7 illustrates the use of fuses in combination with the arrangement of FIGURE 6 using "forward" polarity diodes with the heat sink tied to the positive terminal.

FIGURE 7 schematically illustrates the manner in which current limiting fuses may be used in combination with an arrangement similar to that of FIGURE 6. Thus, in FIGURE 7, the heat sink support member 70 carries three series connected diode blocks 100, 101 and 102 which each receive three parallel connected diodes. Each of the diodes are then connected in series with respective diode fuses 103 through 111. It is often desirable to connect heat sink 70 to the positive terminal. The insulation of diode block 100 is then subjected to the highest voltage of the system. A breakdown at this point could be cleared by the diode fuses 103, 104 and 105, except that these fuses normally should be rated for only ⅓ of the voltage to be cleared. Therefore, it is preferable to use a fuse 112 in series with the A.-C. source connected at terminal 114. Because of the high voltage, it may be desirable to use two lower rated fuses in series, such as 112 and 113.

Figure 8:
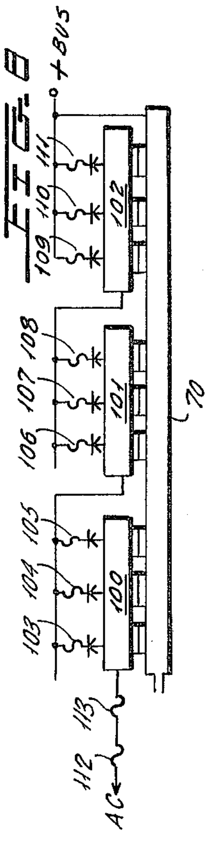
FIGURE 8 is similar to FIGURE 7 using "reverse" polarity diodes.

While FIGURE 7 illustrates the application of the invention for "forward" polarity diodes, FIGURE 8 illustrates the connection for the case of "reverse" polarity diodes. Thus, in FIGURE 8 the diodes of diode blocks 100, 101 and 102 conduct forward current in an opposite direction to that of FIGURE 7. In the case of FIGURE 8, however, a fault in the diode block 100 will not draw fault current through the diode fuses 103, 104 and 105 whereby the use of fuses 112 and 113 in the A.-C. transformer leads are essential, if the heat sink is connected to the positive bus. Note that the same condition would exist when using "forward" polarity diodes if the heat sink is tied to the negative bus.

While FIGURES 7 and 8 refer primarily to the use of the novel diode block arrangement and unitary heat sink for single way rectifiers such as a double Y connected rectifier with an interphase transformer, the novel arrangement has many advantages when used in bridge-connected rectifiers. Note that in all systems the heat sinks and cooling system can be grounded with suitable ground detection systems utilized.

Although I have described preferred embodiments of my novel invention, many variations and modifications will now be obvious to those skilled in the art, and I prefer therefore to be limited not by the specific disclosure herein but only by the appended claims.

The embodiments of the invention in which an exclusive privilege or property is claimed are defined as follows:

1. A diode support structure comprising an elongated conductive member and an elongated heat sink positioned adjacent said elongated conductive member; the opposing surfaces of said conductive member and heat sink having a plurality of spaced flat bosses opposing one another, and a plurality of flat ceramic wafers interposed between each of said opposing bosses; each of said flat ceramic wafers having metallized top and bottom surfaces; said top surfaces of said wafers being soldered to the surfaces of its respective boss on said elongated conductor; said bottom surfaces of said wafers being soldered to the surface of its respective boss on said heat sink; said elongated conductor further having a plurality of diode receiving means on the surface thereof opposite to said surface having said bosses extending therefrom.

2. The structure as set forth in claim 1 where each of said wafers overhang their said respective bosses.

3. The structure as set forth in claim 1 where said diode receiving means comprise spaced tapped openings.

4. The structure as set forth in claim 1 wherein said second member has a cooling fluid conduit therethrough.

5. The structure substantially as set forth in claim 1 wherein all spaces between opposing members are filled with an insulating medium; all edges of said ceramic wafers being covered with said insulating medium to improve the dielectric characteristics of the creepage surfaces.

References Cited by the Examiner

UNITED STATES PATENTS 2,986,679 5/1961 Storsand ---------- 317—100 X

ROBERT K. SCHAEFER, *Primary Examiner.*

M. GINSBURG, *Assistant Examiner.*